US012341037B2

(12) United States Patent
Zhao et al.

(10) Patent No.: US 12,341,037 B2
(45) Date of Patent: Jun. 24, 2025

(54) TEMPERATURE CONTROL APPARATUS FOR SEMICONDUCTOR PROCESSING EQUIPMENT, AND TEMPERATURE CONTROL METHOD FOR THE SAME (71) Applicant: Advanced Micro-Fabrication Equipment Inc. China, Shanghai (CN)

(72) Inventors: Kui Zhao, Shanghai (CN); Hiroshi Iizuka, Shanghai (CN); Dee Wu, Shanghai (CN); Rason Zuo, Shanghai (CN); Tuqiang Ni, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/725,947

(22) Filed: Dec. 23, 2019

(65) Prior Publication Data
US 2020/0211873 A1 Jul. 2, 2020

(30) Foreign Application Priority Data

Dec. 29, 2018 (CN) .......................... 201811631133.3

(51) Int. Cl.
*H01L 21/67* (2006.01)
*H01J 37/32* (2006.01)
(Continued)

(52) U.S. Cl.
CPC .. *H01L 21/67248* (2013.01); *H01J 37/32724* (2013.01); *H01L 21/6833* (2013.01); *H05B 1/0233* (2013.01)

(58) Field of Classification Search
CPC ......... H01J 37/32724; H01L 21/67103; H01L 21/67248; H01L 21/6831; H01L 21/6833; H05B 1/0233
(Continued)

(56) References Cited

U.S. PATENT DOCUMENTS 4,634,843 A * 1/1987 Payne ................ G05D 23/1917
219/486
7,777,152 B2 8/2010 Todorov et al.
(Continued)

FOREIGN PATENT DOCUMENTS

CN 101090259 A 12/2007
CN 103828031 A 5/2014
(Continued)

*Primary Examiner* — Sang Y Paik
(74) *Attorney, Agent, or Firm* — Womble Bond Dickinson (US) LLP (57) ABSTRACT

Disclosed are a temperature control apparatus for semiconductor processing equipment and a corresponding temperature control method, wherein each heating element in each row or each column in a heating element matrix forms a power return circuit with a same power source, respectively, and a same switch module is provided for the power return circuits of all heating elements in each column or each row of the heating element matrix; the input powers to the heating elements in an entire row or column controlled by each power output port of the power source are adjusted by adjusting the output power magnitude of the corresponding power source, and conduction/disconnection of the power return circuits of an entire column or row controlled by each switch module is controlled by controlling ON/OFF of each switch module. The present disclosure reduces circuit complexity and saves costs; the present disclosure reduces temperature control complexity while guaranteeing temperature control accuracy, thereby achieving a uniform and flexible temperature control result.

11 Claims, 5 Drawing Sheets (51) Int. Cl.
*H01L 21/683* (2006.01)
*H05B 1/02* (2006.01)

(58) Field of Classification Search
USPC .......................................... 219/443.1–468.2
See application file for complete search history.

(56) References Cited

U.S. PATENT DOCUMENTS

| | | | |
|---|---|---|---|
| 8,637,794 B2 | 1/2014 | Singh et al. | |
| 8,872,384 B2 | 10/2014 | Stratakos et al. | |
| 9,123,755 B2 | 9/2015 | Swanson et al. | |
| 9,324,589 B2 | 4/2016 | Pease et al. | |
| 9,698,074 B2 | 7/2017 | Merry et al. | |
| 10,049,948 B2 | 8/2018 | Gaff et al. | |
| 2002/0053563 A1* | 5/2002 | Pastore | H05B 3/746 |
| | | | 219/448.11 |
| 2004/0144769 A1* | 7/2004 | Pastore | H05B 3/746 |
| | | | 219/447.1 |
| 2013/0220989 A1* | 8/2013 | Pease | H01L 21/6831 |
| | | | 219/458.1 |
| 2014/0154819 A1* | 6/2014 | Gaff | H01L 22/14 |
| | | | 156/345.52 |
| 2017/0186592 A1 | 6/2017 | Ni et al. | |
| 2018/0040496 A1 | 2/2018 | Lee et al. | |
| 2020/0027706 A1* | 1/2020 | Jing | H01L 21/67069 |

FOREIGN PATENT DOCUMENTS

| | | |
|---|---|---|
| CN | 104205307 A | 12/2014 |
| CN | 105556656 A | 5/2016 |
| GB | 2531599 A | 4/2016 |
| JP | 2013536512 A | 9/2013 |
| KR | 20160092035 A | 8/2016 |
| KR | 20170076582 A | 7/2017 |
| KR | 20170105639 A | 9/2017 |
| TW | 200812226 A | 3/2008 |
| TW | 201407708 A | 2/2014 |
| TW | 201438097 A | 10/2014 |
| TW | 201735232 A | 10/2017 |
| WO | 2013025852 A1 | 2/2013 |

* cited by examiner

TEMPERATURE CONTROL APPARATUS FOR SEMICONDUCTOR PROCESSING EQUIPMENT, AND TEMPERATURE CONTROL METHOD FOR THE SAME

FIELD

This application claims priority benefit from Chinese Patent Applications No. 201811631133.3 filed Dec. 29, 2018 the disclosure of which is hereby incorporated herein by reference in its entirety.

The present disclosure relates to a temperature control apparatus for semiconductor processing equipment, and a temperature control method for semiconductor processing equipment.

BACKGROUND

Plasma processors are widely applied in the semiconductor industry for high precision processing (e.g., plasma etching, and chemical vapor deposition (CVD) processing) the substrates. During plasma processing, temperature of the substrate has much influence on processing results, and different temperature distributions on the substrate surface lead to different processing results. To better control temperature of the substrate, a heater array which may actively control heating power is generally provided between the base supporting the substrate and the electrostatic chuck; in this way, by inputting different powers into heaters in different areas, spatial temperature control is realized.

Figure 1:
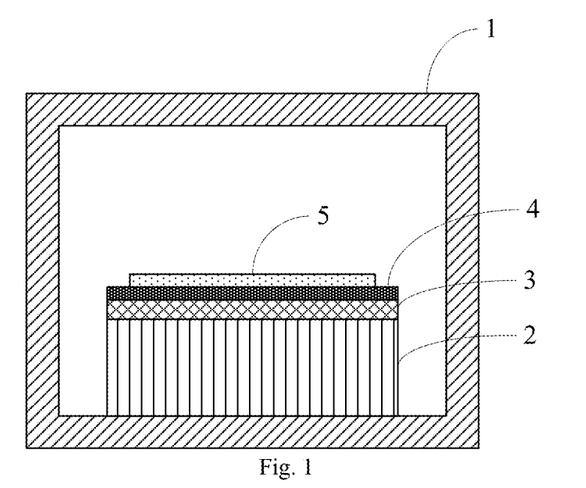
FIG. 1 shows a structural schematic diagram of a plasma processor in the prior art.
Figure 2:
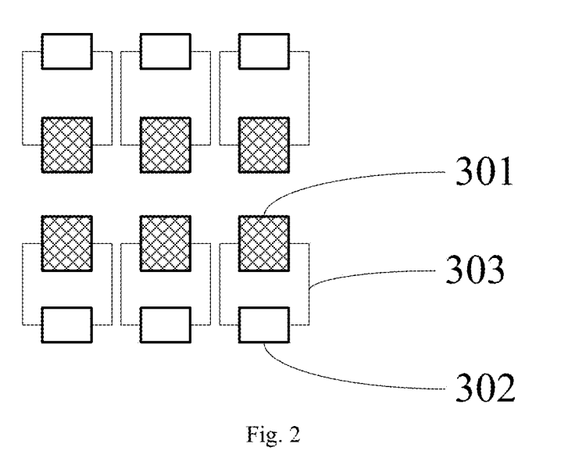
FIG. 2 is a top view of a heater in the prior art.

As shown in FIG. 1, a plasma processor generally comprises a reaction chamber 1, a base 2 disposed in the reaction chamber, an electrostatic chuck 4 which is disposed on the base and configured for supporting a substrate 5, and a heater 3 which is disposed below the electrostatic chuck 4 and configured for adjusting temperatures of the electrostatic chuck 4 and the substrate 5. As shown in FIG. 2, to facilitate adjusting temperatures in different zones and to enhance uniformity and controllability of temperature adjustment, the heater generally includes a plurality of heating elements 301 arranged in a certain order, each heating element 301 being connected to one power source 302 via a power supply line 303, such that the output heat of the corresponding heating element 301 may be adjusted by adjusting the output power of the power source 302; and in this way, the temperature of the corresponding zone may be adjusted. The heater is configured as such to perform independent control with respect to each heating element, which requires a large number of power supply lines and power sources, resulting in a complex heater structure and a high cost; besides, the temperature control can hardly be stabilized; an over large temperature difference between each independently controlled temperature zone and its neighboring heater zones would always result in conduction of heat in the surrounding heater zones to or away from the target zone, such that a stable heating power can only be achieved by multiple times of regulation, which slows down the temperature regulating time. On the other hand, such heating elements are located within a RF (RF) power radiation space in the plasma processor, such that each control line or drive line has to pass through a filter so as to be connected to an external control circuit or drive circuit. If there are a large number of heating elements, a corresponding number of filters have to be provided, which dramatically increases the cost; besides, the limited space cannot allow for installation of so many filters. Therefore, conventional drive control circuits with a plurality of heating elements cannot be adapted to application scenarios with a large number (greater than 100) of heated zones. Hence, a novel drive control circuit is desired to control and drive each heating element in a very large number (greater than 200) of heated zones.

SUMMARY

The present disclosure provides a temperature control apparatus for semiconductor processing equipment and a corresponding temperature control method so as to reduce circuit complexity and save costs, which reduces temperature control complexity while guaranteeing temperature control accuracy, thereby achieving a uniform and flexible temperature control result.

To achieve the objective above, the present disclosure provides a temperature control apparatus for semiconductor processing equipment, the temperature control apparatus being provided on a base for the semiconductor processing equipment and disposed below an electrostatic chuck, the temperature control apparatus comprising:

a heating element matrix including a plurality of heating elements, the heating elements being arranged in a row-and-column manner;

a power source including a plurality of heating power output ports, each heating element in a same column of the heating element matrix being electrically connected to a same heating power output port of the power source, heating power outputted by each heating power output port of the power source being individually adjustable; and a plurality of switch modules, wherein a common switch module is provided for power return lines of all heating elements in each row of the heating element matrix, each switch module being configured for controlling conduction/disconnection of the power return lines of the heating elements in an entire row.

In the heating element matrix, each heating element includes a first end and a second end, the first end and the second end being respectively connected to one of a current input end and a current output end, such that current from the power source flows into the heating element via the current input end and flows out via the current output end, wherein plurality of heating elements with their second ends connected to a common power return line form one row, and one of the switch modules serially connected in said power return line; a plurality of heating elements with their first ends connected to a common heating power output port form one column.

Each row and each column in the heating element matrix respectively include a plurality of heating elements; and the temperature control apparatus includes a control unit for controlling output power magnitude of the power output ports and ON/OFF of the switch modules.

The switch module adopts a switch transistor, or an optocoupler, or an MOSFET gate drive circuit.

The present disclosure further provides a temperature control method for semiconductor processing equipment, comprising steps of:

adjusting power source: adjusting output power magnitude of each power output port of the power source to adjust input power to an entire column of heating elements; and adjusting switch modules: controlling ON/OFF of each switch module so as to control Conduction/disconnection of the power return lines of heating elements in an entire row controlled by each switch module.

Temperature control is performed to the heating element matrix by simultaneously adjusting the power source and adjusting the switch modules or by adjusting the power sources or adjusting the switch modules.

The present disclosure further provides semiconductor processing equipment, comprising:
a reaction chamber;
a base disposed in the reaction chamber;
a temperature control apparatus according to claim 1, which is disposed on the base;
an electrostatic chuck disposed on the temperature control apparatus, wherein in the temperature control apparatus, power supply lines for connecting heating elements are embedded in the electrostatic chuck.

The present disclosure further provides a temperature control apparatus for semiconductor processing equipment, the temperature control apparatus is provided on a base in a reaction chamber of the semiconductor processing equipment and disposed below an electrostatic chuck, the temperature control apparatus comprising:
a heating element matrix including a plurality of heating elements, the heating elements being arranged in a row-and-column manner;
a bipolar power source including plurality power output ports, wherein each heating element in one column is connected to a common power output port of bipolar power source, each bipolar power source controlling input power magnitude and polar to an entire row or an entire column of heating elements;
at least two heating elements in each row connect to a common power return line form a group of heating elements, plurality switching elements respectively connect to the groups of heating elements, and conduction directions of the switch elements of each group of heating elements are reverse to each other.

The temperature control apparatus includes a control unit, the control unit being configured for controlling the current directions of the bipolar power source and controlling output power magnitudes of the bipolar power source.

The present disclosure further provides a temperature control method for semiconductor processing equipment, comprising steps of:
adjusting current directions of power source: reversing the current direction of each bipolar power source, wherein when the bipolar power source supplies a forward current, the power return circuit of a heating element with a forward conduction switch element is conducted, and the power return circuit of a heating element with a reverse conduction switch element is disconnected; and when the bipolar power source supplies a reverse current, the power return circuit of the heating element with the forward conduction switch element is disconnected, and the power return circuit of the heating element with the forward conduction switch element is conducted; and
adjusting input power magnitude: adjusting the output power magnitude of each bipolar power source to adjust the input power to an entire row or an entire column of heating elements controlled by each bipolar power source.

Temperature control with respect to the heating element matrix is performed by simultaneously adjusting current directions of power sources and adjusting input power magnitude, or temperature control with respect to the heating element matrix is performed by adjusting current directions of power sources or adjusting input power magnitude.

The present disclosure further provides semiconductor processing equipment, comprising:
a reaction chamber;
a base disposed in the reaction chamber;
a temperature control apparatus according to claim 8, which is disposed on the base; and
an electrostatic chuck disposed on the temperature control apparatus, wherein in the temperature control apparatus, power supply lines for connecting heating elements are embedded in the electrostatic chuck.

According to the temperature control apparatus and the corresponding temperature control method provided by the present disclosure, heating elements in an entire row or column share one power source, thereby reducing the number of power sources and further saving costs. As heating elements in an entire row or column share a same power source and the heating elements in an entire column or row share a same switch module, the number of power supply lines is significantly reduced, which also achieves the objective of saving costs. Because one power source may simultaneously adjust the input power to an entire row or column of heating elements and one switch module may also simultaneously control connection/disconnection with respect to an entire column or row of heating elements, it becomes unnecessary to control individual heating elements discretely, which reduces the complexity of controlling the heating elements; further, by simultaneously adjusting the input power magnitude of each power output port of the power source and controlling ON/OFF of each switching module, a uniform and flexible temperature control result may be still achieved without sacrificing the temperature control accuracy with respect to the heating elements.

DETAILED DESCRIPTION OF EMBODIMENTS

Hereinafter, preferred embodiments of the present disclosure will be illustrated in detail with reference to FIGS. 3-8.

The present disclosure provides a temperature control apparatus for semiconductor processing equipment, wherein the temperature control apparatus is provided on a base inside a reaction chamber and configured for uniformly controlling substrate temperature.

The temperature control apparatus includes a plurality of heating elements, the heating elements being disposed below an electrostatic chuck (ESC) and configured for heating the electrostatic chuck and conducting heat to the substrate provided on the electrostatic chuck so as to control substrate temperature.

Figure 3:
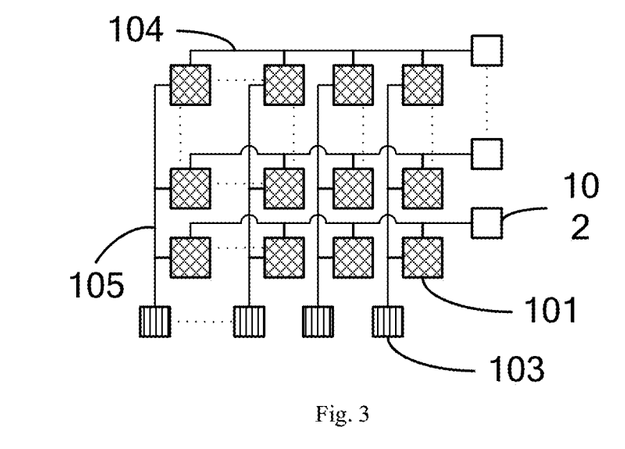
FIG. 3 is a structural schematic diagram of a temperature control apparatus provided according to the present disclosure.

As shown in FIG. 3, the heating elements are arranged in a matrix, wherein a plurality of heating elements 101 are arranged in M rows and N columns, such that there are totally M*N heating elements arranged in the heating element matrix, M and N being both natural numbers, wherein the values of M and N may be reasonably selected based on the area of the electrostatic chuck and the area of each heating element, and the interval between neighboring heating elements may also be reasonably set. The heating elements 101 in each row (or each column) are connected to a same power source 102 via their respective power supply feeding line 104 and power supply return line 105, wherein the output power magnitude of the power source 102 is adjustable; the heating elements 101 in each column (or each row) are connected to a same switch module 103 via their respective power supply feeding line 104 or power supply return line 105, wherein the switch module 103 is configured for controlling connection/disconnection of all heating elements 101 in each column (or each row) with/from the corresponding power source. Because the heating elements in an entire row or column share a same power source, the number of power sources is reduced, which further saves costs. Because the heating elements in an entire row or column share a same power source and the heating elements in an entire column or row share a same switch module, the number of power supply lines is significantly reduced, which also saves costs. One power source may simultaneously adjust input powers to an entire row or column of heating elements, and one switch module may also simultaneously control connection/disconnection with respect to an entire column or row of heating elements, it becomes unnecessary to control individual heating elements discretely, which reduces the complexity of controlling the heating elements; further, by simultaneously adjusting the input power magnitude of each power output port of the power source and controlling ON/OFF of each switching module, a uniform and flexible temperature control result may be still achieved without sacrificing the temperature control accuracy with respect to the heating elements.

Figure 4:
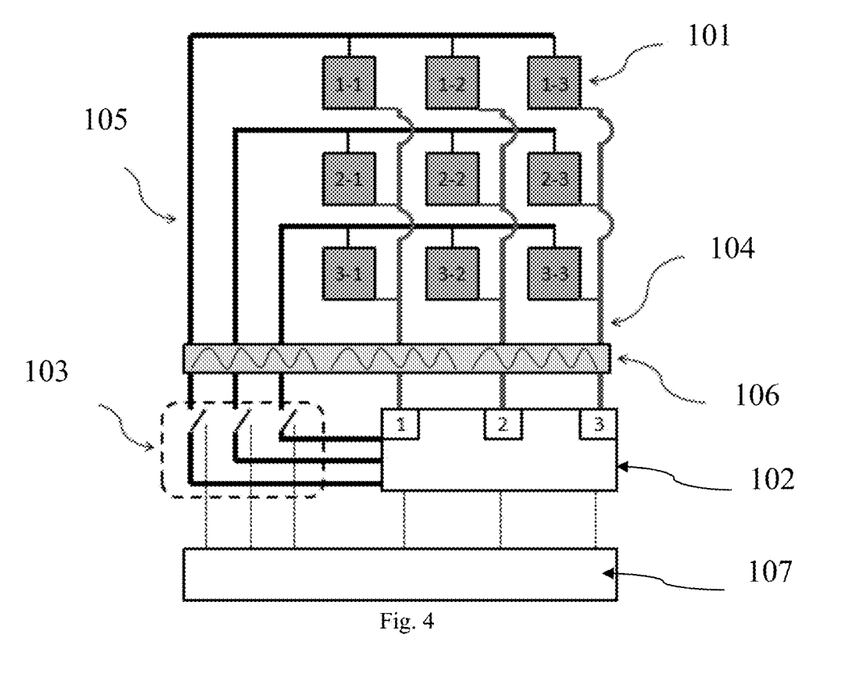
FIG. 4 is a structural schematic diagram of the temperature control apparatus in one embodiment of the present disclosure.

As shown in FIG. 4, in an embodiment of the present disclosure, the heating elements in the temperature control apparatus are arranged in a standard matrix, wherein each heating element 101 is named in a "row-column" fashion, i.e., the heating element 1-1 is located in the first row and the first column, and the heating element 3-2 is located in the third row and the second column. The heating elements in each column are all connected to the same power source 102 via the power supply feeding lines 104 and the power supply return lines 105, such that the number of power output port (1-3) of power source 102 is equivalent to the number of columns of heating elements. The power source 102 is implemented by a programmable power supply. The power source 102 is connected with the control unit 107, such that under the control of the control unit, each power output port of the power source 102 may adjust the output power magnitude, such that the heating power for each column of heating elements may be adjusted, which further adjusts the temperature of the heating area corresponding to each column of heating elements. The power supply return lines 105 of the heating elements in each row are all connected to the same switch module 103 (disposition of the switch module 103 on the power return circuit of a heating element is only required to be capable of controlling ON/OFF of the power supply for the heating element; in an alternative embodiment, the switch module may also be provided on the power supply feeding line 104 of the heating element). The switch module 103 includes a plurality of switch elements, each switch element is correspondingly provided in the power return circuit of each heating element in each row, and respective switch elements in the switch module 103 act simultaneously, i.e., simultaneously opened or simultaneously closed. The switch module 103 is connected to the control unit 107. The control unit 107 sends a control signal to the switch module to control ON/OFF of the switch module 103, thereby controlling connection/disconnection of the power return circuits of the heating elements in each row to further adjust the temperature of the heating area corresponding to the heating elements in each row. In the heating element matrix, each heating element correspondingly controls one heated zone; the temperature of the heated area corresponding to the heating elements in each column of the heating element matrix is controlled based on the output power magnitude of the corresponding power output port of the power source, and the temperature of the heated area corresponding to the heating elements in each row in the heating element matrix is controlled by ON/OFF of the corresponding switch module. By performing row-column control separately via the corresponding power source and the corresponding switch module, superimposed control with respect to each heating element is achieved, such that each heating element in the heating matrix may be controlled via the corresponding power source and the corresponding switch module, thereby enhancing the flexibility and accuracy of temperature control with respect to the heated zone corresponding to each heating element. For example, when one switch element in the switch module 103 is conducted, one row of heating elements is conducted with the power source 102. The power source 102 has a plurality of heating power output ports (i.e., output ports with individually adjustable output powers); different voltages/powers outputted at these heating power output ports are conducted to corresponding heating elements in different columns, offering an optimum heating power for an entire row of conducted heating elements. After one row of heating elements with the optimum power distribution completes heating, another switch element in the switch module 103 is in turn conducted, and then heating elements in another row perform independent and controllable heating. With such a row-to-row scanning, the heating element matrix may complete heating power distribution adjustment within the shortest time. In this embodiment, the power source may be optionally configured to control each row of heating elements; as such, a switch module is optionally configured to control each column of heating elements, wherein the control principle is identical to the scheme discussed above.

To ignite the plasma, it is needed to introduce a high-frequency RF power into the plasma processor; however, such high-frequency (MHz) high-power (KW) RF power seriously interferes with various electrical elements (e.g., the heating elements in the present disclosure) in the reaction chamber of the plasma processor; besides, power flowing out of these heating elements to an external heating power supply also causes leakage of the RF power in the reaction chamber. To prevent the RF power from flowing out of the RF radiation space through the switch module 103 and power source 102, an RF filter 106 is provided in the temperature control apparatus. To achieve a better filtering result, the power supply feeding line 104 and return line 105 are both connected to the RF filter 106; particularly, the power supply line connected to the switch module is connected to the RF filter 106 so as to shield signal interference to a maximum extent.

Figure 5:
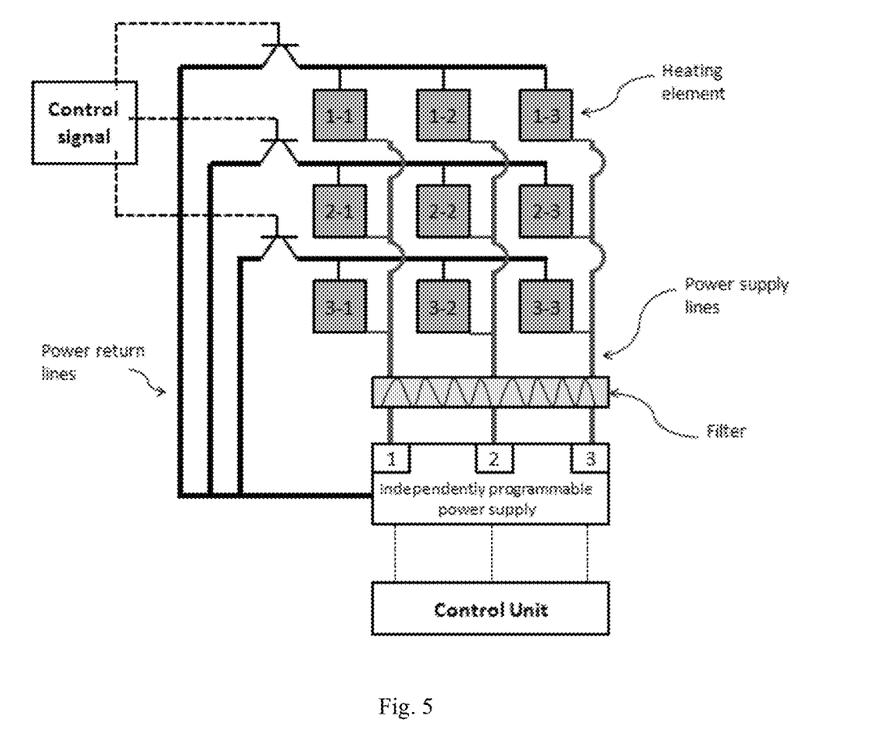
FIG. 5 is a structural schematic diagram of the temperature control apparatus in another embodiment of the present disclosure.

As shown in FIG. 5, in another embodiment of the present disclosure, the heating elements are still arranged in a standard matrix, wherein the matrix arrangement manner and the connection manners for the power sources and the switch modules are all identical to those shown in FIG. 4.

The switch module may adopt a switch transistor. The switch transistor works in a cutoff region and a saturation region, corresponding to circuit breaking and conducting. Due to its properties of breaking and conducting, the switch transistor is widely applied in various switch circuits, e.g., typical switch power circuits, drive circuits, high-frequency oscillation circuits, analog-to-digital conversion circuits, pulse circuits, and output circuits, etc. The base of the switch transistor is connected to the control unit 107 via a wire, and the collector and emitter of the switch transistor are connected in the power return circuit of the heating element 101; when the control unit 107 transmits a low voltage level signal to the switch transistor, because the base has no current, the collector has no current either, and the load connected to the collector end has no current either, corresponding to switch opening (disconnected state); at this point, the switch transistor still works in the cutoff region, wherein the power return circuits of a plurality of heating elements controlled by the switch transistor are opened, the heating elements stop heating, and the temperatures of the corresponding heated zones drop; when the control unit 107 transmits a high voltage level signal to the switch transistor, because the base has current flowing, an even higher amplified current flows through the collector, and thus the load return circuit is conducted, corresponding to switch closing (conducted state); at this point, the switch transistor works in the saturation region, wherein the power return circuits of the plurality of heating elements controlled by the switch transistor are closed, the heating elements start heating, and the temperature of the corresponding heated area rises. To prevent the control signal emitted by the control unit 107 to the switch transistor from being interfered with by the high-frequency signal of the power source during the wire transmission process, an RF filter 106 is provided to attenuate the interference signal after the control signal transmitted by the control unit 107 via the wire connected to the switch transistor is filtered by the RF filter 106.

The switch module may also adopt an optocoupler. The optocoupler (OC) is also referred to as an optical isolator. The optocoupler is an electrical-optical-electrical converter which transmits an electrical signal with light as medium. The optocoupler converts an electrical signal from the input end to an optical signal with light as medium, and the optical signal is coupled to the output end and then converted to an electrical signal. This is why the electrical-optical-electrical converter is referred to as optocoupler. Because the input and output ends of the optocoupler are mutually isolated and the electrical signal is unidirectionally transmitted, the optocoupler has good electrical isolation and anti-interference properties. The optocoupler has characteristics such as a small size, a long service life, without contacts, strong anti-interference capacity, input-output isolation, and unidirectional signal transmission, such that it sometimes may replace a relay, a transformer, or a chopper, etc. and is thus widely applied to electrical insulation, level conversion, level translation, inter-stage coupling, drive circuits, switch circuits, choppers, multivibrators, signal isolation, inter-stage isolation, pulse amplifier circuits, digital meters, long-distance signal transmission, pulse amplification, solid state relay (SSR), instruments, communication devices, and microcomputer interfaces. A light-emitting device of the optocoupler typically adopts a light-emitting diode or a laser tube, and a receiving device thereof typically adopts a photosensitive diode, a photosensitive transistor, or an optical integrated circuit, etc. The light-emitting device of the optocoupler is connected to the control unit 107 via an optical fiber; the receiving device of the optocoupler is serially connected in the power return circuit of the heating element 101. When the control unit 107 transmits an optical signal to the optocoupler, the optocoupler is conducted, the power return circuits of a plurality of heating elements controlled by the optocoupler are closed, the heating elements start heating, and the temperatures of corresponding heated zones rise; when the control unit 107 stops transmitting an optical signal to the optocoupler, the optocoupler is disconnected, the power return circuits of the plurality of heating elements controlled by the optocoupler are opened, the heating elements stop heating, and the temperatures of the corresponding heated zones drop. The control signal emitted by the control unit 107 is transmitted via an optical fiber, avoiding interference from the high-frequency signal generated by the power source; as such, the RF filter 106 may be omitted.

The switch module may optionally adopt an MOSFET (Metal Oxide Semiconductor Field Effect Transistor) gate drive circuit. MOSFET is voltage controlled device, which may serve as an electrical circuit, a motor driver, or a switch element in other systems. The gate is an electric isolation control end of each MOSFET device, and the other two ends of MOSFET are source and drain (for IGBT, the source and the drain are referred to as collector and emitter, respectively). To operate the MOSFET/IGBT, a voltage is generally applied to the gate (termed relative to the source/emitter of the device), wherein a specific driver is used to apply voltage and supply drive current to the gate of a power device. The gate of the MOSFET is connected to the control unit 107 via a wire; the source and drain of the MOSFET (which are collector and emitter for IGBT) are connected in the power return circuit of the heating element 101. When the control unit 107 emits a gate drive signal to the MOSFET, if the gate voltage exceeds a threshold voltage, the source and the drain are conducted, the power return circuits of a plurality of heating elements controlled by the MOSFET are closed, the heating elements start heating, and the temperatures of the corresponding zones rise; when the control unit 107 stops emitting the gate drive signal to the MOSFET, the source and the drain are opened, the power return circuits of the plurality of heating elements controlled by MOSFET are disconnected, the heating elements stop heating, and the temperatures of the corresponding heated zones drop. To prevent the gate drive signal emitted by the control unit 107 to the MOSFET from being interfered with by a high frequency signal of the power source during the transmission process via wire, an RF filter 106 is provided to attenuate the interference signal after the gate drive signal emitted by the control unit 107 via the wire connected to the switch transistor is filtered by the RF filter 106. In an application scenario, a wireless control mode may be optionally adopted to implement control of the MOSFET gate drive circuit, wherein a wireless module is used to supply a gate drive signal to the gate of the MOSFET, and the wireless module and the MOSFET communicate with each other via a high-frequency radio signal. The wireless module may be disposed external to the reaction chamber of the semiconductor device, wherein the wireless module may transmit the gate drive signal to the MOSFET via Bluetooth or infrared, thereby implementing control of ON/OFF of the MOSFET. The wireless control mode may eliminate the wires between the MOSFET and the control unit, which further simplifies device design and saves cost.

One end of each heating element 101 is connected to the power supply feeding line 104, and the other end thereof is connected to the power supply return line 105, wherein the power supply feeding line 104 and the power supply return line 105 are collectively referred to as a power supply line. The heating element 101 is connected in the heating loop of the power source 102 by a power supply line, and the switch module 103 is provided in the heating loop. To reduce high frequency signal interference, an RF filter 106 is provided in the heating loop. In a preferred embodiment, the power supply lines connected to two ends of the heating element 101 are embedded in the electrostatic chuck; while the heating element 101 is disposed beneath and in contact with the electrostatic chuck. The power source 102, the switch module 103, and the RF filter 106 are disposed external to the electrostatic chuck; moreover, to reduce the number of power supply lines, the power sources 102, the switch modules 103, and the RF filters 106 should be disposed as close to the electrostatic chuck as possible.

Figure 6:
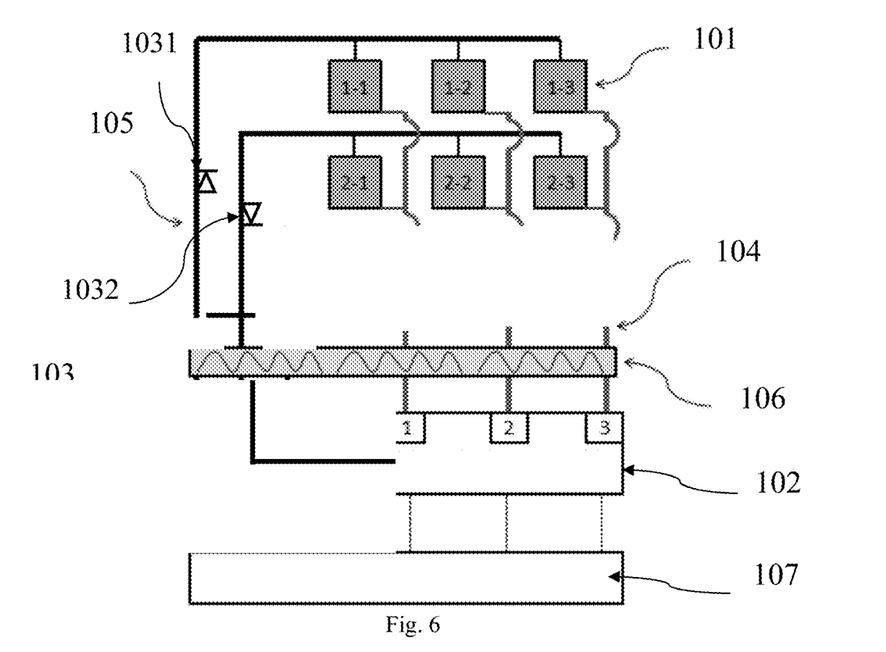
FIG. 6 is a structural schematic diagram of the temperature control apparatus in a third embodiment of the present disclosure.

To further reduce the number of power supply lines, the present disclosure may optionally adopt the power output ports of a bipolar power source 102 to control the heating elements. As shown in FIG. 6, the heating elements in the temperature control apparatus are still arranged in a standard matrix. With a 3×2 matrix as an example, each heating element 101 is named in a "row-column" fashion, i.e., the heating element 1-1 is located in the first row and the first column, and the heating element 2-1 is located in the second row and the first column; the heating elements 1-1 and 2-1 in the first column are both connected to the No. 1 power source (referred to as the first power source) via power supply lines, wherein the first power source is a bipolar power source, which may supply forward and reverse currents. A switch element is respectively provided in the power return circuits of the heating elements 1-1 and 2-1. The switch element may be provided on the power supply feeding line of the heating element or on the power supply return line of the heating element. The switch element uses a directional device, e.g., a diode or a transistor, etc. With the heating element 1-1 and the heating element 2-1 as an example, a first switch element 1031 is disposed on the power supply return line 105 of the heating element 1-1, and a second switch element 1032 is disposed on the power supply return line 105 of the heating element 2-1; the conduction direction of the first switch element 1031 is reverse to the conduction direction of the second switch element 1032. For example, the first switch element 1031 may be set to be reversely conducted, and the second switch element 1032 may be set to be forwardly conducted. The power supply return lines of the heating element 1-1 and the heating element 2-1 after their respective switch elements (i.e., the portions of power supply lines not embedded in the electrostatic chuck) may share a same power supply line, thereby reducing power supply lines. Even further, if the switch elements are disposed on the power supply feeding lines of the heating elements, the two heating elements may then share one power supply return line, further reducing the number of power supply lines. In this embodiment, it is unnecessary to separately control individual switch elements. Still with the heating element 1-1 and the heating element 2-1 as an example, if it is needed to let the heating element 1-1 to heat the zone where it is located, the control unit 107 controls the first power source to supply a reverse current; at this point, the first switch element 1031 is conducted, while the second switch element 1032 cannot be conducted; therefore, the power return circuit of the heating element 1-1 is conducted, and the heating element 1-1 heats the zone where it is located; while the power return circuit of the heating element 2-1 is disconnected such that it cannot perform heating. On the contrary, if it is needed to let the heating element 2-1 to heat the zone where it is located, the control unit 107 controls the first power source to provide a forward current; at this point, the second switch element 1032 is conducted, the first switch element 1031 cannot be conducted; as such, the power return circuit of the heating element 2-1 is conducted to start heating the zone where it is located, while the power return circuit of the heating element 1-1 is disconnected to stop heating. In this embodiment, through cooperation between the power output ports of a bipolar power source and the switch elements, all heating elements connected to the same bipolar power source may be controlled simultaneously. When the power source supplies a forward current or a reverse current, only the power return circuits of a half number of heating elements can be conducted, and the power return circuits of the other half number of heating elements are disconnected; two heating elements connected to a same power source have different current conduction directions; in this way, the two heating elements may share a same power supply return line; hence, the entire temperature control apparatus may save on a half number of power supply return lines.

The heating elements in the temperature control apparatus provided by the present disclosure may be alternatively arranged in a non-typical matrix fashion. The "rows" and "columns" in the matrix are unnecessarily arranged in straight lines, wherein the numbers of heating elements in all rows are not necessarily identical, and the numbers of heating elements in all columns are not necessarily identical either. In other words, the "rows" and "columns" may be arranged in various fashions, and the numbers of heating elements in the "rows" and "columns" are also variable (allowing blanks in the matrix).

Figure 7:
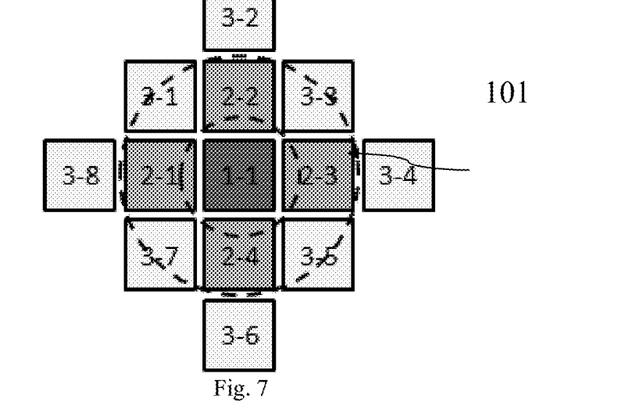
FIGS. 7 and 8 are schematic diagrams of layout of heating elements.

As shown in FIG. 7, each heating element 101 is still named in a "row-column" fashion, wherein the manners of connecting the heating elements with the power sources and the switch modules (or switch elements) in the matrix and the manners of controlling the heating elements are also identical to the schemes discussed above, i.e., controlling the temperatures of the heated zones corresponding to the heating elements in each column or each row in the heating element matrix by controlling the output power magnitude of the corresponding power source, and/or controlling the temperatures of the heated zones corresponding to the heating elements in each row or each column in the heating element matrix by conduction/disconnection of the switch power supply. In this embodiment, each row of the matrix may be arranged in a circle, wherein the first row only includes one heating element 1-1, which is arranged in the center of the whole matrix; the heating elements in the second row (including four heating elements) are arranged surrounding the heating element 1-1 in the first row; the heating elements in the third row (including eight or more heating elements) are further arranged surrounding the heating elements in the second row; the heating elements in the fourth row (including more heating elements than the third row) are arranged surrounding the heating elements in the third row; so on and so forth, such that the whole heating element matrix is arranged like circles.

Figure 8:
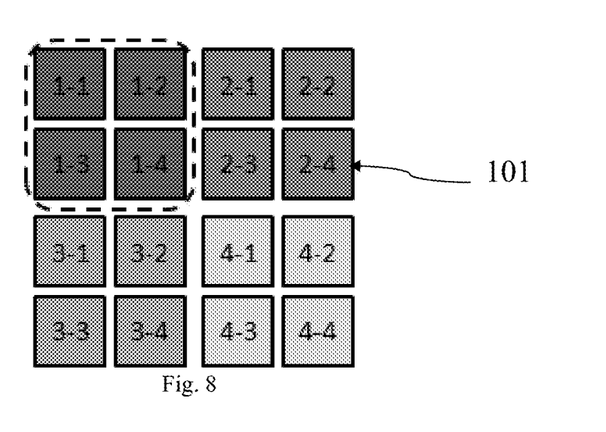

As shown in FIG. 8, with a 4×4 matrix as an example, wherein each heating element 101 is still named in a "row-column" fashion, wherein the manners of connecting the heating elements with the power sources and the switch modules (or switch elements) in the matrix and the manners of controlling the heating elements are also identical to the manners discussed above, i.e., controlling the temperatures of the heated zones corresponding to the heating elements in each column or each row in the heating element matrix by controlling the output power magnitude of the corresponding power source, and/or controlling the temperatures of the heated zones corresponding to the heating elements in each row or each column in the heating element matrix by conduction/disconnection of the switch power supply. In this embodiment, the heating elements in each row of the matrix are all arranged in one area. For example, the four heating elements in the first row are all disposed in the upper left corner area of the matrix, the four heating elements in the second row are all disposed in the upper right corner area of the matrix, the four heating elements in the third row are all disposed in the lower left corner area of the matrix, and the four heating elements in the fourth row are all disposed in the lower right corner area of the matrix; the power source may implement control of the four main areas in the matrix (i.e., the upper left corner, the upper right corner, the lower left corner, and the lower right corner), and the switch module may implement separate control of each heating element in the four main areas.

According to the temperature control apparatus and the corresponding temperature control method provided by the present disclosure, heating elements in an entire row or column share one power source, which reduces the number of power sources and further saves costs. Because heating elements in an entire row or column share a same power source and the heating elements in an entire column or row share a same switch module, the number of power supply lines is significantly reduced, which also saves costs. One power source may simultaneously adjust the input powers to the heating elements in an entire row or column and one switch module may also simultaneously control conduction/disconnection with the heating elements in an entire column or row, it is unnecessary to control individual heating elements discretely, which reduces the complexity of controlling the heating elements; further, by simultaneously adjusting the input power magnitude of each power output port of the power source and controlling ON/OFF of each switching module, a uniform and flexible temperature control result may be still achieved without sacrificing the temperature control accuracy with respect to the heating elements. In the present disclosure, one row shares one switch, and one column is only connected to the output end of one heating power supply; therefore, the overall number of filters required is significantly reduced. For example, in the MxN heating element matrix shown in FIG. 4, there only needs 2N number of filters; in the embodiment shown in FIGS. 5 and 6, there only needs N+1 number of filters. Hence, the present disclosure may dramatically reduce the number of filters and significantly reduce costs.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:
1. A temperature control apparatus for semiconductor processing equipment, wherein the temperature control apparatus being provided on a base for the semiconductor processing equipment and disposed below an electrostatic chuck, the temperature control apparatus comprising:
   a heating element matrix including a plurality of heating elements, the heating elements being arranged in a row-and-column manner;
   a programmable power source including a plurality of independent heating power output ports outputting a plurality of output voltages with different not-zero voltage values that are individually adjusted, the different non-zero voltage values outputted at different heating power output ports being conducted to corresponding heating elements in different columns; a number of the heating power output ports being equivalent to a number of columns of heating elements, the programmable power source simultaneously adjusting an output voltage value of each power output port individually, each independent heating element in a same column of the heating element matrix being electrically connected directly to a same heating power output port of the programmable power source by one of a plurality of power supply lines, such that each power output port of the programmable power source individually adjusts the output voltage value, such that an output voltage for each column of heating elements is adjusted separately;
   a plurality of switch modules, wherein each switch module of the plurality of switch modules is common to a power return line of an entire row of heating elements and thereby controls conduction/disconnection of the power return lines of the heating elements in the entire row;
   a control unit individually adjusting the plurality of output voltages outputted by the plurality of independent heating power output ports of the programmable power source and each switch module, so that the plurality of output voltages are applied independently to the plurality of the heating elements in the same row at the same time;
   and,
   an RF filter disposed external to the electrostatic chuck, wherein all of the power supply lines and the power return lines are connected to the RF filter, wherein the plurality of switch modules includes a switch transistor, wherein a base of the switch transistor is connected to the control unit, and a collector and an emitter of the switch transistor are connected to a corresponding power return line of heating elements, wherein, when the control unit transmits a low voltage value signal to the switch transistor, the switch transistor is open, and wherein, when the control unit transmits a high voltage value signal to the switch transistor, the switch transistor is closed, and wherein the RF filter attenuates an interference signal by filtering a control signal transmitted by the control unit to the switch transistor.

2. The temperature control apparatus for semiconductor processing equipment according to claim 1, wherein in the heating element matrix, each heating element includes a first end and a second end, the first end and the second end being respectively connected to one of a current input end and a current output end, such that current from the programmable power source flows into the heating element via the current input end and flows out via the current output end, wherein plurality of heating elements with their second ends connected to a common power return line form one row, and one of the switch modules serially connected in said power return line; and wherein a plurality of heating elements with their first ends connected to a common heating power output port form one column.

3. The temperature control apparatus for semiconductor processing equipment according to claim 2, wherein each row and each column in the heating element matrix respectively include a plurality of heating elements; and the temperature control apparatus includes the control unit for controlling output the voltage values of the power output ports and ON/OFF of the switch modules.

4. A temperature control method for semiconductor processing equipment, wherein temperature control is performed using the temperature control apparatus according to claim 1, the temperature control method comprising steps of:
adjusting power source: adjusting output voltage value of each power output port of the power source to adjust input power to an entire column of heating elements; and
adjusting switch modules: controlling ON/OFF of each switch module so as to control conduction/disconnection of the power return lines of heating elements in an entire row controlled by each switch module.

5. The temperature control method for semiconductor processing equipment according to claim 4, wherein temperature control is performed to the heating element matrix by simultaneously adjusting the power source and adjusting the switch modules or by adjusting the programmable power sources or adjusting the switch modules.

6. Semiconductor processing equipment, comprising:
a reaction chamber;
a base disposed in the reaction chamber;
a temperature control apparatus according to claim 1, which is disposed on the base; and
an electrostatic chuck disposed on the temperature control apparatus, wherein in the temperature control apparatus, power supply lines for connecting heating elements are embedded in the electrostatic chuck.

7. A temperature control apparatus for semiconductor processing equipment, wherein the temperature control apparatus is provided on a base in a reaction chamber of the semiconductor processing equipment and disposed below an electrostatic chuck, the temperature control apparatus comprising:
a heating element matrix including a plurality of heating elements, the heating elements being arranged in a row-and-column manner;
a bipolar power source including a plurality of power output ports outputting a plurality of output voltages with different not-zero voltage values that are individually adjusted, the different non-zero voltage values outputted at different heating power output ports being conducted to corresponding heating elements in different columns, a number of the heating power output ports being equivalent to a number of columns of heating elements, the bipolar power source simultaneously adjusting an output voltage value of each power output port individually, wherein each heating element in one column is connected to a common power output port of the bipolar power source, each bipolar power source controlling input voltage value and polarity to an entire column of heating elements such that each power output port of the bipolar power source individually adjusts the output voltage value, such that an output voltage for each column of heating elements is adjusted separately;
a control unit individually adjusting the plurality of output voltages outputted by the plurality of heating power output ports of the bipolar power source and each switch module of a plurality of switching modules, so that the plurality of output voltages are applied independently to the plurality of the heating elements in the same row at the same time;
at least two heating elements in each row connected to a common power return line form a group of heating elements, the plurality of switching modules being respectively connected to the groups of heating elements, and conduction directions of the switch modules of each group of heating elements are reverse to each other; and
an RF filter inserted between the bipolar power source and the plurality of heating elements, wherein all of the plurality of power output ports and the power return lines are connected to the RF filter, wherein the plurality of switch modules includes a switch transistor, wherein a base of the switch transistor is connected to the control unit, and a collector and an emitter of the switch transistor are connected to a corresponding power return line of heating elements, wherein, when the control unit transmits a low voltage value signal to the switch transistor, the switch transistor is open, and wherein, when the control unit transmits a high voltage value signal to the switch transistor, the switch transistor is closed, and wherein the RF filter attenuates an interference signal by filtering a control signal transmitted by the control unit to the switch transistor.

8. The temperature control apparatus for semiconductor processing equipment according to claim 7, wherein the temperature control apparatus includes the control unit, the control unit being configured for controlling current directions of the power output ports of a bipolar power source and controlling output voltage values of the power output ports of a bipolar power source.

9. A temperature control method for semiconductor processing equipment, wherein temperature control is performed using the temperature control apparatus according to claim 7, the temperature control method comprising steps of:
adjusting current directions of power source: reversing the current direction of each bipolar power source, wherein when the bipolar power source supplies a forward current, a power return circuit of a heating element with a forward conduction switch element is conducted, and a power return circuit of a heating element with a reverse conduction switch element is disconnected; and when the bipolar power source supplies a reverse current, the power return circuit of the heating element with the forward conduction switch element is disconnected, and the power return circuit of the heating element with the forward conduction switch element is conducted; and
adjusting input voltage value: adjusting the output voltage value of each bipolar power source to adjust the input voltage value to an entire column of heating elements controlled by each bipolar power source, such that each bipolar power source individually adjust the output voltage value thereby a heating power for each column of heating elements is adjusted separately.

10. The temperature control method for semiconductor processing equipment according to claim 9, wherein temperature control with respect to the heating element matrix is performed by simultaneously adjusting current directions of power sources and adjusting input voltage value, or temperature control with respect to the heating element matrix is performed by adjusting current directions of power sources or adjusting input voltage value.

11. Semiconductor processing equipment, comprising:
- a reaction chamber;
- a base disposed in the reaction chamber;
- a temperature control apparatus according to claim 7, which is disposed on the base; and
- an electrostatic chuck disposed on the temperature control apparatus, wherein in the temperature control apparatus, power supply lines for connecting heating elements are embedded in the electrostatic chuck.

* * * * *